(12) United States Patent
Nagai

(10) Patent No.: US 10,840,248 B2
(45) Date of Patent: Nov. 17, 2020

(54) RESISTOR FOR DYNAMIC RANDOM ACCESS MEMORY

(71) Applicants: UNITED MICROELECTRONICS CORP., Hsin-Chu (TW); Fujian Jinhua Integrated Circuit Co., Ltd., Quanzhou, Fujian Province (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou (CN)

(*) Notice: Subject to any disclaimer, the term of this patent is extended or adjusted under 35 U.S.C. 154(b) by 0 days.

(21) Appl. No.: 15/904,428

(22) Filed: Feb. 26, 2018

(65) Prior Publication Data

US 2019/0237469 A1  Aug. 1, 2019

(30) Foreign Application Priority Data

Jan. 26, 2018  (CN) .......................... 2018 1 0076676

(51) Int. Cl.
| | |
|---|---|
| *H01L 27/108* | (2006.01) |
| *H01L 23/522* | (2006.01) |
| *H01L 27/08* | (2006.01) |
| *H01L 27/12* | (2006.01) |
| *H01L 21/28* | (2006.01) |
| *H01L 49/02* | (2006.01) |
| *H01L 27/11* | (2006.01) |
| *H01L 27/06* | (2006.01) |

(52) U.S. Cl.
CPC .. *H01L 27/10888* (2013.01); *H01L 21/28061* (2013.01); *H01L 23/5228* (2013.01); *H01L 27/0802* (2013.01); *H01L 27/1203* (2013.01); *H01L 28/20* (2013.01); *H01L 27/0629* (2013.01); *H01L 27/1112* (2013.01)

(58) Field of Classification Search
None
See application file for complete search history.

(56) References Cited

U.S. PATENT DOCUMENTS

| | | |
|---|---|---|
| 5,126,279 A | 6/1992 | Roberts |
| 7,314,829 B2 | 1/2008 | Weiss |
| 7,804,155 B2 | 9/2010 | Chi |
| 8,058,125 B1 | 11/2011 | Lin |
| 8,193,900 B2 | 6/2012 | Fan |

(Continued)

FOREIGN PATENT DOCUMENTS

| | | |
|---|---|---|
| CN | 102956560 A | 3/2013 |
| CN | 105140222 A | 12/2015 |
| CN | 105938851 A | 9/2016 |

*Primary Examiner* — Moazzam Hossain
*Assistant Examiner* — Stanetta D Isaac
(74) *Attorney, Agent, or Firm* — Winston Hsu

(57) ABSTRACT

A resistor for dynamic random access memory includes a substrate with a memory cell region and a peripheral region defined thereon, and a resistor formed on a shallow trench isolation of the substrate, wherein the resistor is provided with a winding portion and terminal portions at two ends of the winding portion. The winding portion is electrically connected with an overlying metal layer through contacts, and the terminal portion includes a polysilicon layer and a metal multilayer from the bottom up.

6 Claims, 5 Drawing Sheets

(56) References Cited

U.S. PATENT DOCUMENTS

| | | | |
|---|---|---|---|
| 2003/0178697 A1* | 9/2003 | Lee | H01L 27/0802 |
| | | | 257/536 |
| 2004/0070033 A1* | 4/2004 | Shin | H01L 27/0629 |
| | | | 257/379 |
| 2006/0118885 A1* | 6/2006 | Song | H01L 27/0629 |
| | | | 257/379 |
| 2008/0081428 A1 | 4/2008 | Lee | |
| 2013/0105912 A1* | 5/2013 | Hsu | H01L 27/0629 |
| | | | 257/379 |
| 2016/0260704 A1* | 9/2016 | Huo | H01L 27/0629 |

* cited by examiner

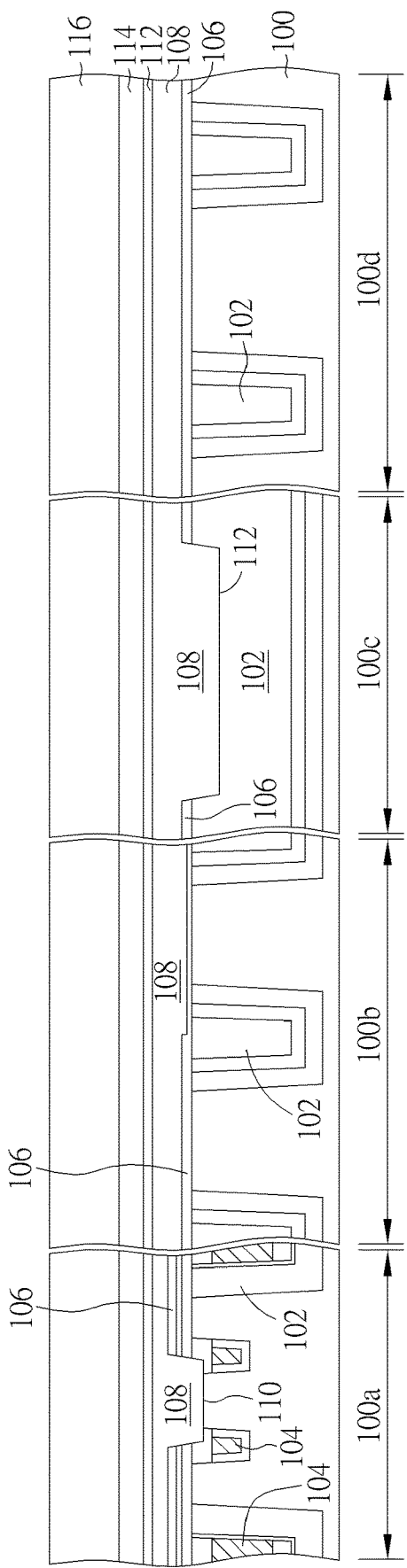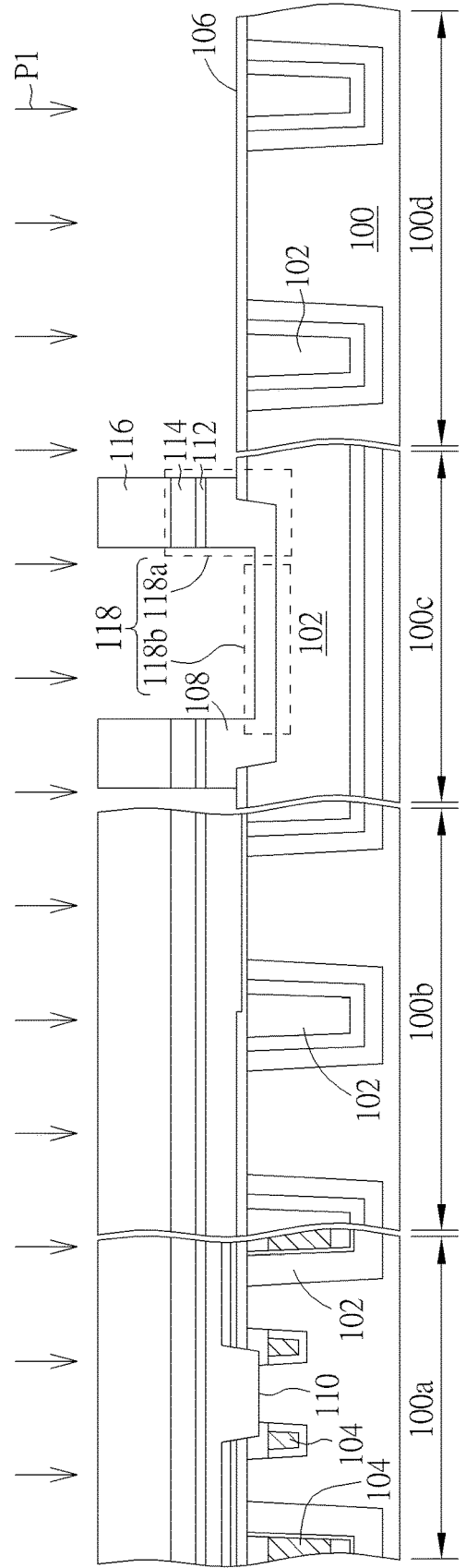
FIG. 1
FIG. 2

RESISTOR FOR DYNAMIC RANDOM ACCESS MEMORY

BACKGROUND OF THE INVENTION

1. Field of the Invention

The present invention relates generally to a resistor for semiconductor devices, and more specifically, to a resistor using in dynamic random access memory (DRAM) and that may be incorporated into memory process.

2. Description of the Prior Art

In addition to transistors, diodes and capacitors, semiconductor structures and semiconductor circuits routinely also incorporate resistors. Resistors may be used within semiconductor circuits as signal processing components and resistive load components. Resistor structures are now commonly implemented in many modern ultra-large scale integrated circuits, and polysilicon is one attractive material for use in forming these integrated resistors, especially as compared with metal materials. Polysilicon structures can be formed with relatively high resistivity, which reduces the area required to implement large value resistors as compared with metal resistor structures, and thus also reduces the parasitic inductance of those structures. Furthermore, because polysilicon structures are typically dielectrically isolated from the underlying silicon substrate, polysilicon resistors generally have much lower parasitic capacitance than diffused resistors. Polysilicon resistors can, therefore, outperform many other semiconductor resistors by means of a highly accurate resistivity, low temperature coefficient and low parasitic capacitance, without any concern for factors like junction or back bias, etc.

However, combining polysilicon resistors and metal-gate MOSFETs onto a single IC chip will encounter many integration issues. One solution for theses issue is to deposit the polysilicon resistor at the same time with depositing the dummy gate and covering the polysilicon resistor with a hard mask, such as a silicide mask. However, this solution would require an additional hard mask deposition and increase the complexity and cost of fabrication processes.

In addition, the resistor in current dynamic random access memory (DRAM) is usually made of doped silicon rather than polysilicon. One method of forming an isolated resistor is to form a resistive N$^-$-doped region within a P-doped region so as to electrically isolate the N-doped region. However, the performance of N-doped resistor doesn't measure up to the one of polysilicon resistor, and its process also needs additional masks for the implantation of N-doped region.

Therefore, an improved polysilicon resistor structure that can be integrated into DRAM process are required to address the above issues in the semiconductor industry.

SUMMARY OF THE INVENTION

In order to solve the above-mentioned insufficient efficacy issue of doped-Si resistor and to incorporate the process of resistor and memory devices, a novel resistor structure and manufacturing method thereof is provided in the present invention. The method features the use of material layers and mask identical to the ones of memory devices to incorporate with the processes of memory devices and to manufacture polysilicon resistors with better performance.

One objective of the present invention is to provide a resistor for dynamic random access memory, which includes a substrate with a memory cell region and a peripheral region defined thereon and a resistor formed on a shallow trench isolation in the substrate, wherein the resistor includes a winding portion and two terminal portions at two ends of the winding portion respectively, and the terminal portion electrically connects to a metal layer through a contact, and the terminal portion includes a polysilicon layer and a metal multilayer from the bottom up.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIGS. 1-3 illustrate the process flow of a resistor in memory process in accordance with one embodiment of the present invention;

Figure 3:
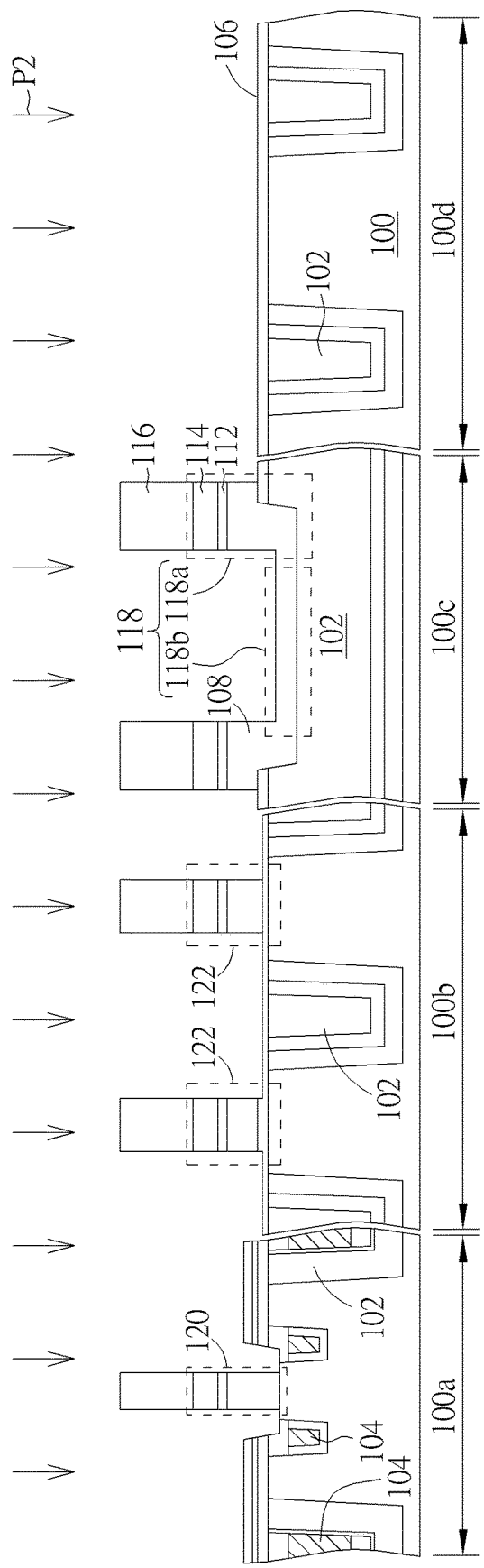

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Before describing the preferred embodiment, the following description will be given for specific terms used throughout the specification. The term "etch" or "etching" is used herein to generally describe a fabrication process of patterning a material, such that at least a portion of the material remains after the etch is completed. For example, it should be understood that the process of etching silicon involves the steps of patterning a photoresist layer above the silicon, and then removing the areas of silicon no longer protected by the photoresist layer. As such, the areas of silicon protected by the photoresist layer would remain behind after the etch process is complete. Since the photoresist is always removed after etch process in general case, it will not be specifically shown in the drawings of the specification unless it is necessary.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The term "substrate," "semiconductor substrate" or "wafer" as described throughout, is most commonly a silicon substrate or a silicon wafer. However, term "substrate" or "wafer" may also refer to any semiconductor material such as germanium, gallium arsenide, indium phosphide, and the like. In other embodiments, the term "substrate" or "wafer" may be non-conductive, such as a glass or sapphire wafer.

It will be explained in the present invention how to manufacture and integrate polysilicon resistor structures into dynamic random access memory (DRAM) process. Different from conventional DRAM architecture that using doped silicon to manufacture resistor, the present invention features the integrated manufacture of resistor with memory devices, wherein the resulted polysilicon resistor structure would have specific features.

FIGS. 1-2 illustrate the process flow of manufacturing a resistor in memory process according to one embodiment of the present invention. First, please refer to FIG. 1. The step of present invention includes providing a substrate 100, such as a silicon wafer. In DRAM architecture, the substrate 100 is generally defined with cell regions 100a for disposing cells of memory device and peripheral regions 100b for disposing circuits and interconnections. In addition, a resistor region 100c for forming resistors and an alignment mark region 100d for forming alignment marks are also shown in the figure in order to exhibit the change of different regions in same process. Please note that the resistor region 100c is possible to be formed in the memory cell region 100a or peripheral region 100b, while the alignment mark region 100d is usually formed in scribe lines.

Please refer again to FIG. 1. Every region on the substrate is preformed with shallow trench isolations (STI) 102 to define the active areas therein for, for example, disposing memory devices in the memory cell region 100a or disposing logic devices in peripheral region 100b. The material of STI 102 may be spin-on dielectric (SOD), such as spin-on silicon oxide, silicon nitride or silicon oxynitride with excellent gap-filling ability to obtain local planarization and form thin dielectric layer. Other oxide layer, nitride layer or liner may be formed around the STI 102 to repair damages on trench sidewall and to prevent the oxidization of silicon substrate in later process, as well as facilitating the formation of STI 102. Please note that, in order to achieve electrical insulation, polysilicon resistor of the present invention is designed to be formed entirely on the STI 102 in the resistor region 100c rather than on the active area.

Refer again to FIG. 1. Regarding the memory cell region 100a, buried word line 104 is preformed within the STI 102 to function as the gate of memory device. The word line 104 is buried within the substrate and extends through defined active areas. For the clarity of drawings and not to obscure essential features of the present invention, detailed features and components relevant to the word line will not be explained in the specification. The regions defined in FIG. 1 are all provided with an insulating layer 106 made of silicon oxide, silicon nitride, silicon oxynitirde, or high-k dielectric material such as hafnium oxide (HfO$_2$) or aluminum oxide (Al$_2$O$_3$). In the embodiment of present invention, the insulating layer 106 in the peripheral region 100b functions as a gate dielectric layer with different thickness. For example, the insulating layer 106 in left part of the peripheral region 100b may be thicker than the insulating layer 106 in right part of the peripheral region 100b. There may be other layer structures under the insulating layer 106 in memory cell region 100a. Relevant explanation will be herein omitted.

Please refer still to FIG. 1. A polysilicon layer 108 is formed on the insulating layer 106 in every region. In the embodiment of present invention, the polysilicon layer 108 in the memory cell region 100a is used to form bit line contacts (BC), and the polysilicon layer 108 in the peripheral region 100b is used to form logic gates, and the polysilicon layer 108 in the resistor region 100c is used to form the resistor of present invention. As shown in FIG. 1, the polysilicon layer 108 in the memory cell region 100a extends downwardly into the recess 110 between word lines 104 and electrically connects with silicon substrate, and the polysilicon layer 108 in the resistor region 100c also extends downwardly to fill up the resistor recess 111 preformed on the STI 102. Please note that in the embodiment of present invention, the depth of resistor recess 111 in the resistor region 100c is deeper than the depth of contact recess 110 in the memory cell region 100a. In the meanwhile, the top surface of polysilicon layer 108 in every region is flush with each other due to planarization process.

Refer again to FIG. 1. Metal layers 112, 114 and a hard mask layer 116 are further formed sequentially on the polysilicon layer 108 in every region. The resistance of metal layers 12, 114 is smaller than the underlying polysilicon layer 108, wherein the metal layer 122 functions as a conductive barrier which may be made of metal nitride such as titanium nitride, tantalum nitride or tungsten nitride, with optional transition metal such as titanium or tantalum included therein. The material of metal layer 114 may be common contact metal, such as tungsten, or tungsten silicide possibly. The hard mask layer 116 is made of insulating materials such silicon nitride or silicon oxynitride, which may provide moderate etch selectivity with respect to the underlying conductive layers. Please note that in the embodiment of present invention, the above-mentioned layer structures 112, 114, 116 are all flush with each other in every region.

Please now refer to FIG. 2. After the above-mention layer structures are formed, a photolithographic and etch process P1 is performed to remove the layer structure on the alignment mark region 100d in order to expose alignment marks. In this step, the polysilicon layer 108, the metal layers 112, 114 and the hard mask layer 116 on the alignment mark region 100d are all removed completely, while the layer structures in the memory cell region 100a and the peripheral region 100b are intact. Please note particularly that the layer structures in the resistor region 100c are patterned into the structure like the one shown in FIG. 2. More specifically, the layer structures of polysilicon layer 108, metal layers 112, 114 and hard mask layer 116 outside the resistor recess 111 will be removed, except for the portions at two ends. The layer structures at two end would be reserved to form the upwardly-extending terminal portion 118a of resistor. The terminal portion 118a includes the polysilicon layer 108 and the metal layers 112, 114 to electrically connect with contacts to be formed in later process. The polysilicon layer 108 remaining in the resistor recess 111 forms the winding portion 118b of resistor. The winding portion 118b and the terminal portion 119a of resistor are formed simultaneously and integratedly.

Please refer next to FIG. 3. After the terminal portion 118a and the winding portion 118b of resistor are formed, another photolithographic and etch process P2 is performed to pattern the layer structures in the memory cell region 100a and the peripheral region 100b into bit lines, bit line contacts 120 and logic gates 122. Both of the bit line contact 120 and the logic gate 122 include the above-mentioned layer structures like polysilicon layer 108 and metal layers 112, 114.

The steps explained above represents that the resistor 118 in the present invention may be formed integratedly in DRAM process, especially for the step of manufacturing bit line contacts, by using identical layer structures without additional processes or material costs. Furthermore, since the bit line contact 120 in the memory cell region 100a and the logic gate 122 in the peripheral region 100b is formed of polysilicon, this kind of integrated process enable the manufacture of polysilicon type resistor with better electrical performance compared to the conventional doped Si type resistor. Please note that in other embodiment, the patterning step of resistor 118 in FIG. 2 may be instead integrated in the patterning step of bit line contact 120 and logic gate 122 in FIG. 3. It is not limited to be performed in the removing process of layer structures in the alignment mark region.

Figure 4:
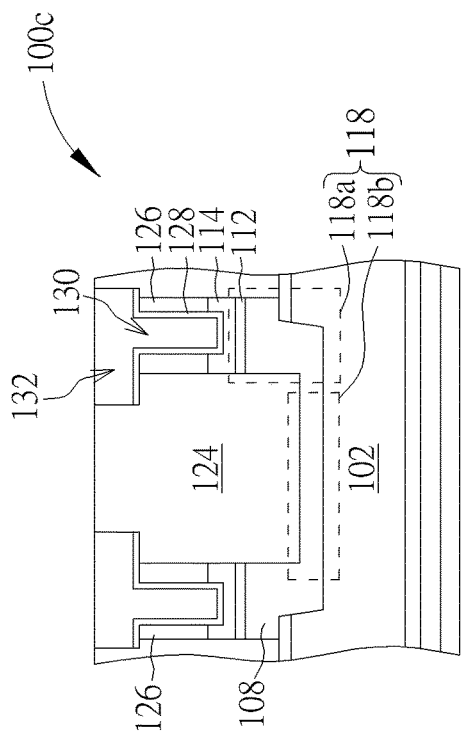
FIG. 4 is a schematic cross-sectional view of a resistor in accordance with one embodiment of the present invention.

Please refer next to FIG. 4. After the above-mentioned bit line contact 120 and logic gate 122 are formed, the manufacture of contact structures in every region is then conducted. Since the present invention focuses on the manufacture of resistor 118, the details in other regions at this stage will not be shown in FIG. 4. The step of forming contacts may include forming an interlayer dielectric (ILD) 124 on the substrate. For example, a silicon oxide layer is formed covering on the resistor 118 to obtain a flat process surface. Dual damascene recesses 126 are then formed in the ILD 124 at the two terminal portions 118a of resistor 118. The metal layer 114 of resistor 118 is exposed from the bottom of dual damascene recess 126. The dual damascene recess 126 is then formed with a barrier layer 128 such as titanium layer or titanium nitride layer and is filled with metal material such as tungsten, so that contact structure 130 and overlying metal layer 132 (ex. MO metal layer) are formed as shown in the figure. The resistor 118 is electrically connected to the overlying metal layer 132 through the contact 130. Please note that contact structures may also be formed concurrently in the memory cell region 100a and peripheral region 100b in this step.

Figure 5:
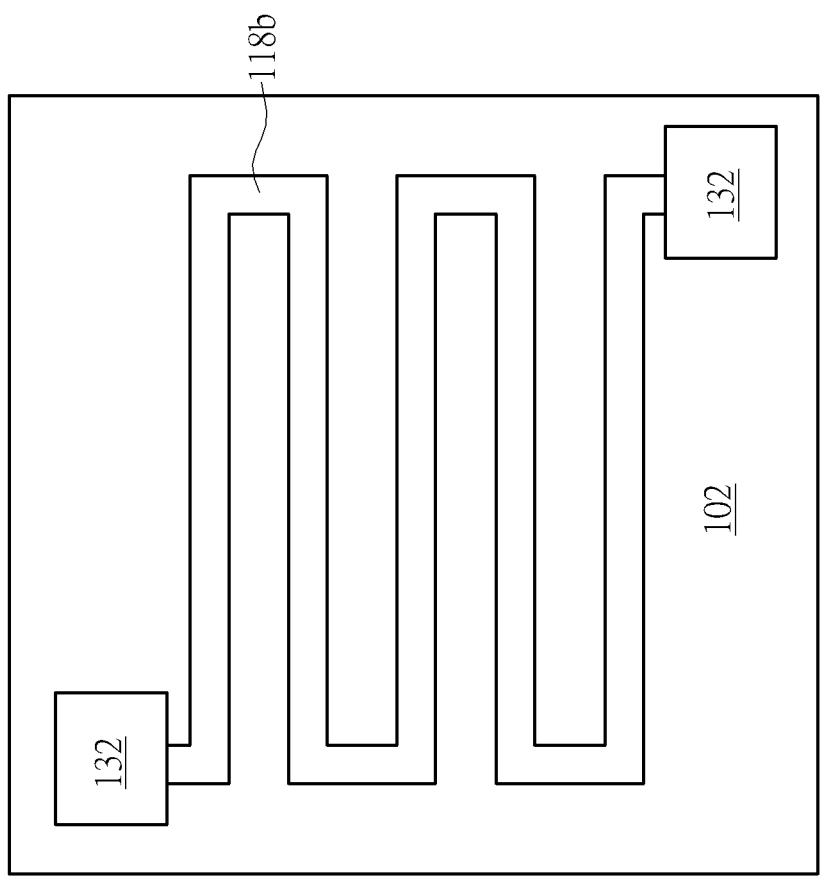
FIG. 5 is a schematic top view of a resistor in accordance with one embodiment of the present invention.

Please refer to FIG. 5, which is a schematic top view of the resistor according to one embodiment of the present invention. In the embodiment of present invention, the winding portion 118b of resistor 118 is actually distributed on the substrate surface in a winding and tortuous fashion, with a length depending on the desired resistance. The terminal portion 118a of resistor 118 and the overlying metal layer 132 connected thereon are disposed at two ends of the winding portion 118b. In this way, a polysilicon resistor is formed and integrated in the DRAM architecture.

Figure 6:
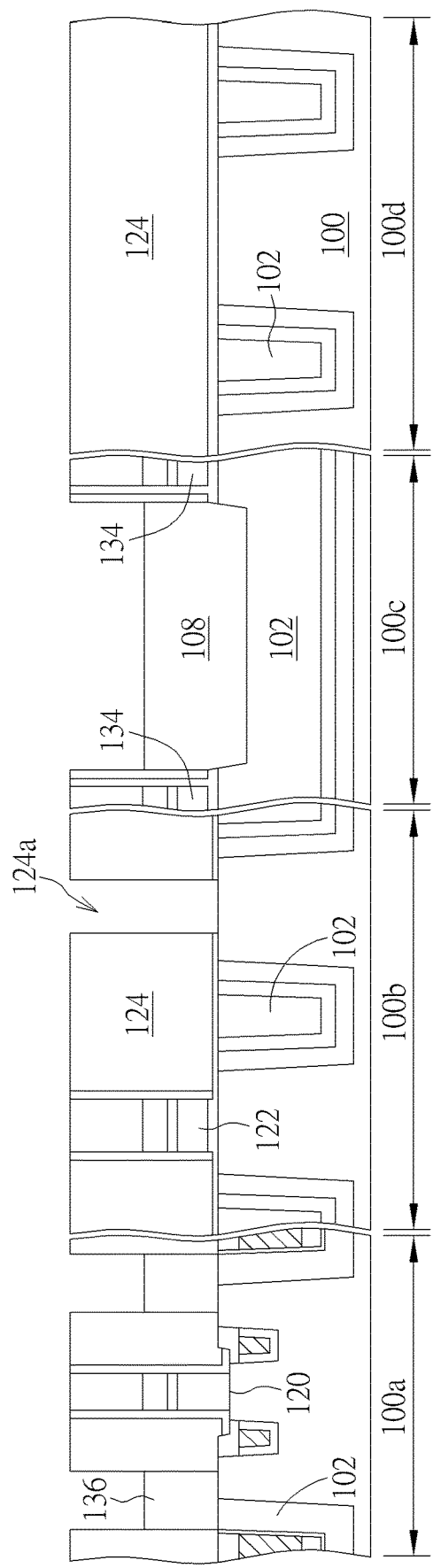
FIGS. 6-9 illustrate the process flow of a resistor in memory process in accordance with another embodiment of the present invention.

In addition to the above-described embodiment relevant to the process of bit line contacts in DRAM, the resistor of present invention may also be integrated into the process of other components in DRAM. Please refer now to FIGS. 6-9, which illustrate a process flow of manufacturing a resistor in memory process according to another embodiment of present invention. Please refer to FIG. 6 first. Most structures and components in FIG. 6 are identical to the one in previous embodiment. The differences between the two embodiments are that the memory cell region 100a in this figure is already formed with bit line and bit line contact 120 and the peripheral region 100b is already formed with logic gate 122, and the polysilicon layer 108 in the resistor region 100c is formed between the bit lines 134, and the alignment mark region 100d is formed with an interlayer dielectric (ILD) 124 instead of the polysilicon layer 108.

In this embodiment, polysilicon storage node contact (SC) 136 is formed in the memory cell region 100a with a top surface flush with the top surface of polysilicon layer 108 in the resistor region 100c. ILD 124 are also formed surrounding the logic gate 122 in the peripheral region 100b with contact holes 124a extending downwardly to the underlying substrate.

Figure 7:
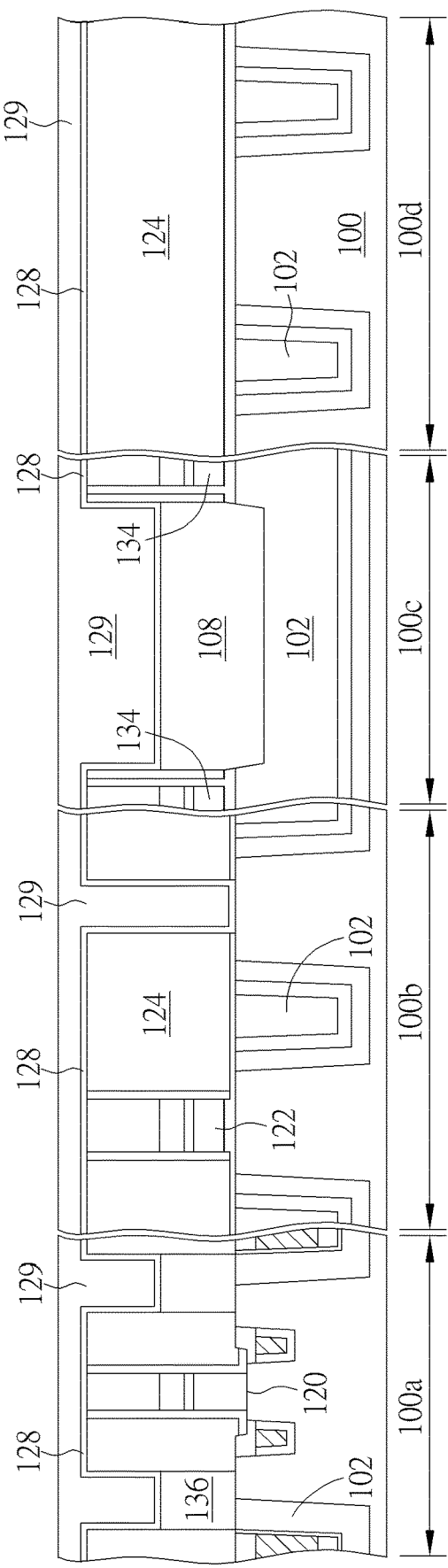

Please refer now to FIG. 7. Similar to the previous embodiment, a barrier layer 128 and filling metals 129 are also formed on the storage node contact 136 in the memory cell region 100a and on the polysilicon layer 108 in the resistor region 100c in order to form contacts and overlying metal layer in later processes. The filling metal 129 is also filled into the contact hole 124a in the peripheral region 100b. Different from the previous embodiment, the polysilicon layer 108 in the resistor region 100c have yet to be patterned into the winding portion and the terminal portions of resistor at this stage.

Figure 8:
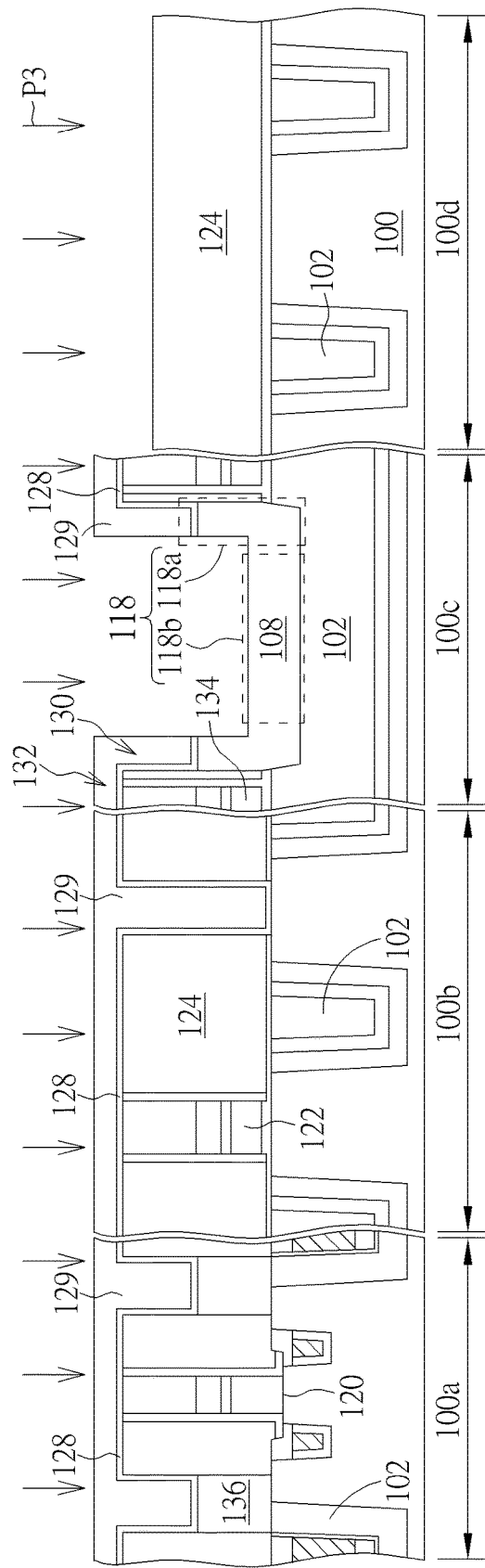

Please refer next to FIG. 8. After the barrier layer 128 and the filling metal 129 are formed, a photolithographic and etch process P3 is performed to remove the barrier layer 128 and the filling metal 129 in the alignment mark region 100d in order to expose alignment marks. In this step of embodiment, the barrier layer 128 and the filling metal 129 in the alignment mark region 100d are completely removed, while the layer structures in the memory cell region 100a and the peripheral region 100b are intact. Please note that the polysilicon layer 108 and the filling metal 129 in the resistor region 100c would be patterned into the structure as the one shown in FIG. 8. More specifically, all filling metal 129 and polysilicon layer 108 in the resistor region 100c are removed except for the portion at two ends of recess, thereby forming the winding portion 118b of resistor 118. The filling metal 129 and the polysilicon layer 108 at two ends of recess are reserved to form the upwardly-extending terminal portions 118a of resistor 118 and the overlying contact 130 and metal layer 132 electrically connecting therewith.

Figure 9:
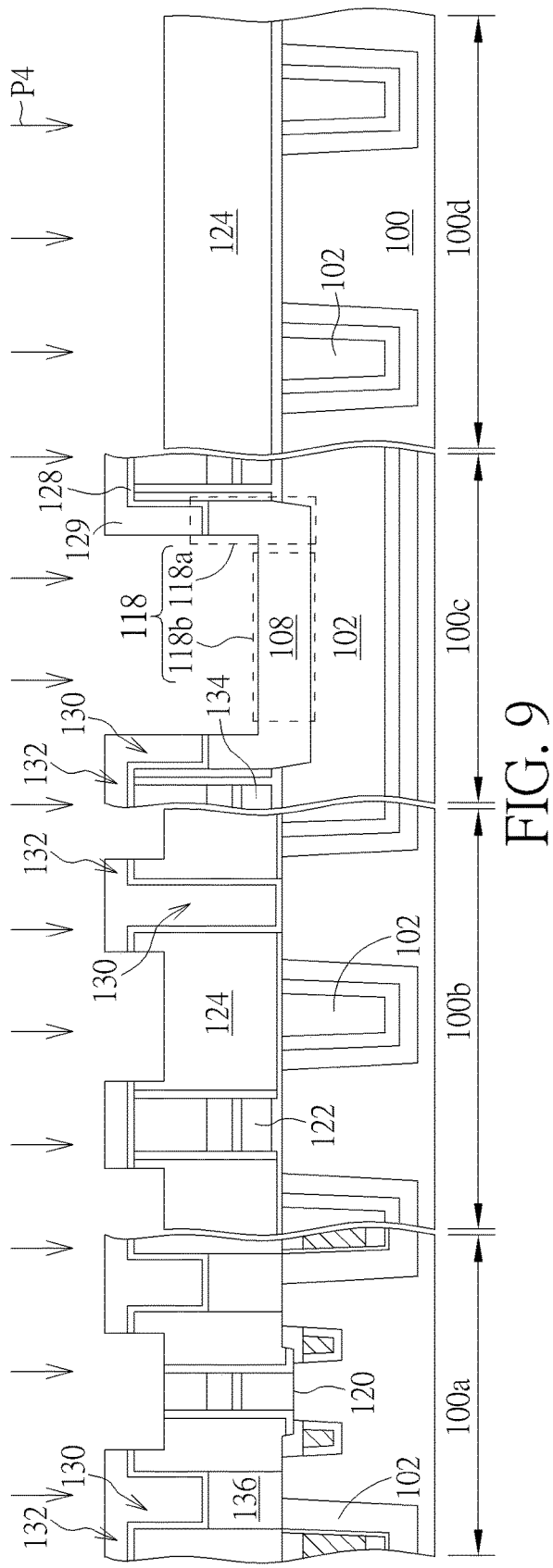

Please refer to FIG. 9. After the above-mentioned terminal portions 118a and winding portion 118b of resistor are formed, another photolithographic and etch process P2 is then performed to pattern the barrier layer 128 and filling metal 129 in the memory cell region 100a and peripheral region 100b, thereby forming the contact 130 and overlying metal layer 132 in the memory cell region 100a and peripheral region 100b.

Similar to previous embodiment, the steps explained above represents that the resistor 118 in the present invention may be formed integratedly in DRAM process, especially for the step of manufacturing storage node contact, by using identical layer structures without additional processes or material costs. Furthermore, since the storage node contact 136 in the memory cell region 100a is formed inherently of polysilicon, this kind of integrated process enable the manufacture of polySilicon type resistor with better electrical performance compared to conventional doped Si type resistor. Please note that in other embodiment, the patterning step of resistor 118 in FIG. 8 may be instead integrated in the patterning step of contact 130 and overlying metal layer 132 in the memory cell region 100a and peripheral region 100b

What is claimed is:

1. A resistor for dynamic random access memory, comprising:
   a substrate with a memory cell region and a peripheral region defined thereon; and
   a resistor on a shallow trench isolation in said substrate, wherein said shallow trench isolation has a resistor recess, and said resistor comprises a winding portion in said resistor recess and two terminal portions upwardly-extending at two ends of said winding portion respectively, and said upwardly-extending terminal portion electrically connects to a metal layer through a contact, and said upwardly-extending terminal portion comprises a polysilicon layer formed and integrated with said winding portion and upwardly-protruding higher than said winding portion and a metal multilayer from the bottom up; and
   a bit line contact formed in said memory cell region, wherein said bit line contact comprises said polysilicon layer and said metal multilayer identical to and with same height as said polysilicon layer and said metal multilayer of said terminal portion of said resistor, and a bottom surface of said winding portion of said resistor is lower than said bit line contact.

2. The resistor for dynamic random access memory of claim 1, further comprising a logic gate in said peripheral region, wherein said logic gate comprises said polysilicon layer and said metal multilayer identical to and with same height as said polysilicon layer and said metal multilayer of said terminal portion of said resistor.

3. The resistor for dynamic random access memory of claim 2, wherein the bottom surface of said winding portion of said resistor is lower than said logic gate.

4. The resistor for dynamic random access memory of claim 1, wherein the material of said metal multilayer comprises titanium, titanium nitride, tungsten or tungsten silicide.

5. The resistor for dynamic random access memory of claim 1, wherein said resistor electrically connects to a MO metal layer through said contact.

6. A resistor for dynamic random access memory, comprising:
   a substrate with a memory cell region and a peripheral region defined thereon; and
   a resistor on a shallow trench isolation in said substrate, wherein said shallow trench isolation has a resistor recess, and said resistor comprises a winding portion in said resistor recess and two terminal portions upwardly-extending at two ends of said winding portion respectively, and said upwardly-extending terminal portion electrically connects to a metal layer through a contact, and said upwardly-extending terminal portion comprises a polysilicon layer formed and integrated with said winding portion and upwardly-protruding higher than said winding portion and a metal multilayer from the bottom up; and
   a storage node contact formed in said memory cell region, wherein said storage node contact comprises said polysilicon layer identical to and with same height as said polysilicon layer of said terminal portion of said resistor, and a bottom surface of said winding portion of said resistor is lower than said storage node contact.

* * * * *